United States Patent
Chen et al.

(10) Patent No.: US 9,443,904 B1
(45) Date of Patent: Sep. 13, 2016

(54) LIGHT-EMITTING DIODE DISPLAY AND MANUFACTURING METHOD THEREOF

(71) Applicant: MIKRO MESA TECHNOLOGY CO., LTD., Apia (WS)

(72) Inventors: Li-Yi Chen, Tainan (TW); Chih-Hui Chan, Tainan (TW); Chun-Yi Chang, Tainan (TW); Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/846,842

(22) Filed: Sep. 7, 2015

(51) Int. Cl.
| | |
|---|---|
| *H01L 33/00* | (2010.01) |
| *H01L 27/15* | (2006.01) |
| *H01L 33/62* | (2010.01) |
| *H01L 33/54* | (2010.01) |
| *H01L 33/58* | (2010.01) |
| *H01L 33/14* | (2010.01) |
| *H01L 33/44* | (2010.01) |

(52) U.S. Cl.
CPC ............ *H01L 27/156* (2013.01); *H01L 33/14* (2013.01); *H01L 33/44* (2013.01); *H01L 33/54* (2013.01); *H01L 33/58* (2013.01); *H01L 33/62* (2013.01); *H01L 2933/005* (2013.01); *H01L 2933/0025* (2013.01); *H01L 2933/0066* (2013.01); *H01L 2933/0091* (2013.01)

(58) Field of Classification Search
CPC ...... H01L 33/52; H01L 33/54; H01L 41/047
USPC .................................... 257/98, 99, 100
See application file for complete search history.

(56) References Cited

U.S. PATENT DOCUMENTS

2016/0056351 A1* 2/2016 Yang ................. H01L 33/60
257/98

\* cited by examiner

*Primary Examiner* — Tan N Tran
(74) *Attorney, Agent, or Firm* — CKC & Partners Co., Ltd.

(57) ABSTRACT

A light-emitting device display includes a substrate, a first bottom electrode, a second bottom electrode, a micro light emitting device, a first isolation layer, an opposite electrode, and an encapsulation layer. The first and second bottom electrodes are disposed on the substrate. The micro light emitting device is disposed on the first bottom electrode and electrically connected to the first bottom electrode. The first isolation layer at least partially covers a side surface of the micro light emitting device, in which the first isolation layer has a refractive index $n_1$, and the micro light emitting device has a refractive index $n_{device}$, and $n_{device} \geq n_1$. The opposite electrode is disposed on the micro light emitting device and electrically connected to the micro light emitting device and the second bottom electrode. The encapsulation layer at least covers the micro light emitting device and the first isolation layer.

20 Claims, 17 Drawing Sheets

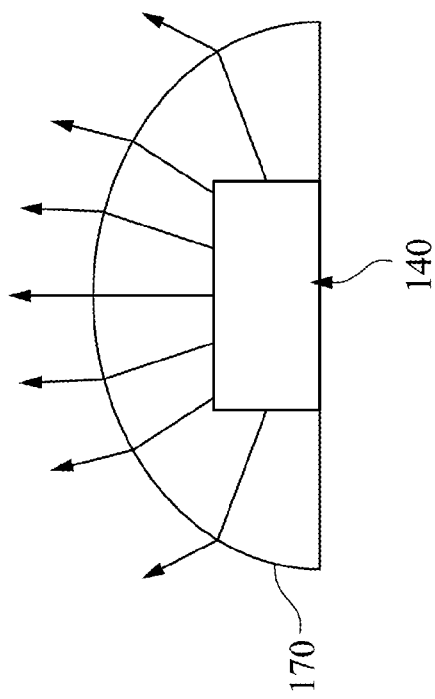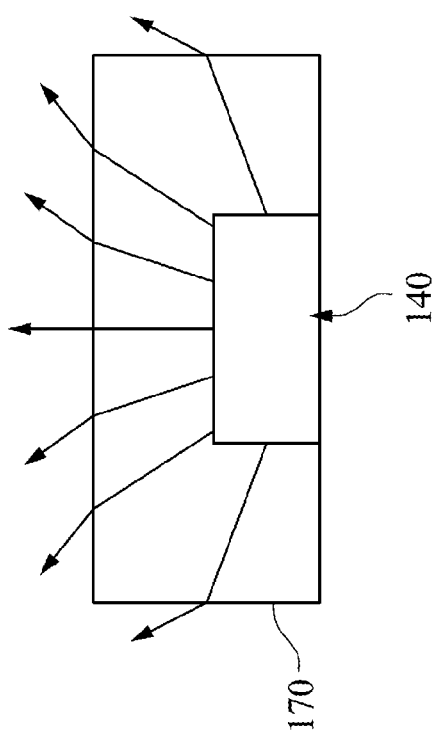
Fig. 7

LIGHT-EMITTING DIODE DISPLAY AND MANUFACTURING METHOD THEREOF

BACKGROUND

1. Technical Field

The present disclosure relates to a light-emitting diode (LED) display.

2. Description of Related Art

In recent years, advances in LED technology have made dramatic improvement in luminance intensity and color fidelity. Due to theses improved technology, a full color LED display device has become available and in common use.

However, although the luminance intensity is improved in recent years, the light extraction efficiency of a LED in a display device may still be limited by the outside medium (either air or an encapsulation layer) due to total internal reflection. More specifically, the light extraction efficiency of the LED is defined as the ratio of the LED's external quantum efficiency to the LED's internal quantum efficiency. Since some of light generated in the LED's active region may never reaches the external environment due to the total internal reflection with the outside medium, there is still room for improvement for increasing the light extraction efficiency of the LED.

SUMMARY

This invention provides an LED display with enhancing light extraction efficiency of the LED.

In one aspect of the present invention, the LED display is provided. The LED display includes a substrate, a first bottom electrode, a second bottom electrode, a micro light emitting device, a first isolation layer, an opposite electrode and an encapsulation layer. The first and second bottom electrodes are disposed on the substrate. The micro light emitting device is disposed on the first bottom electrode and is electrically connected to the first bottom electrode. The first isolation layer at least partially covers a side surface of the micro light emitting device, in which the first isolation layer has a refractive index $n_1$, the micro light emitting device has a refractive index $n_{device}$, and $n_{device} \geq n_1$. The opposite electrode is disposed on the micro light emitting device and is electrically connected to the micro light emitting device and the second bottom electrode. The encapsulation layer at least covers the micro light emitting device and the first isolation layer.

Since the refractive index $n_1$ of the first isolation layer is less than or equal to the refractive index $n_{device}$ of the micro light emitting device, the total internal reflection on the contacted interface between the first isolation layer and the side surface of the micro light emitting device can be reduced, thereby enhancing the light extraction efficiency of the micro light emitting device.

BRIEF DESCRIPTION OF THE DRAWINGS

FIG. 7 shows the optical path according to the embodiment of FIG. 4 and the embodiment of FIG. 6.

DETAILED DESCRIPTION

Figure 1:
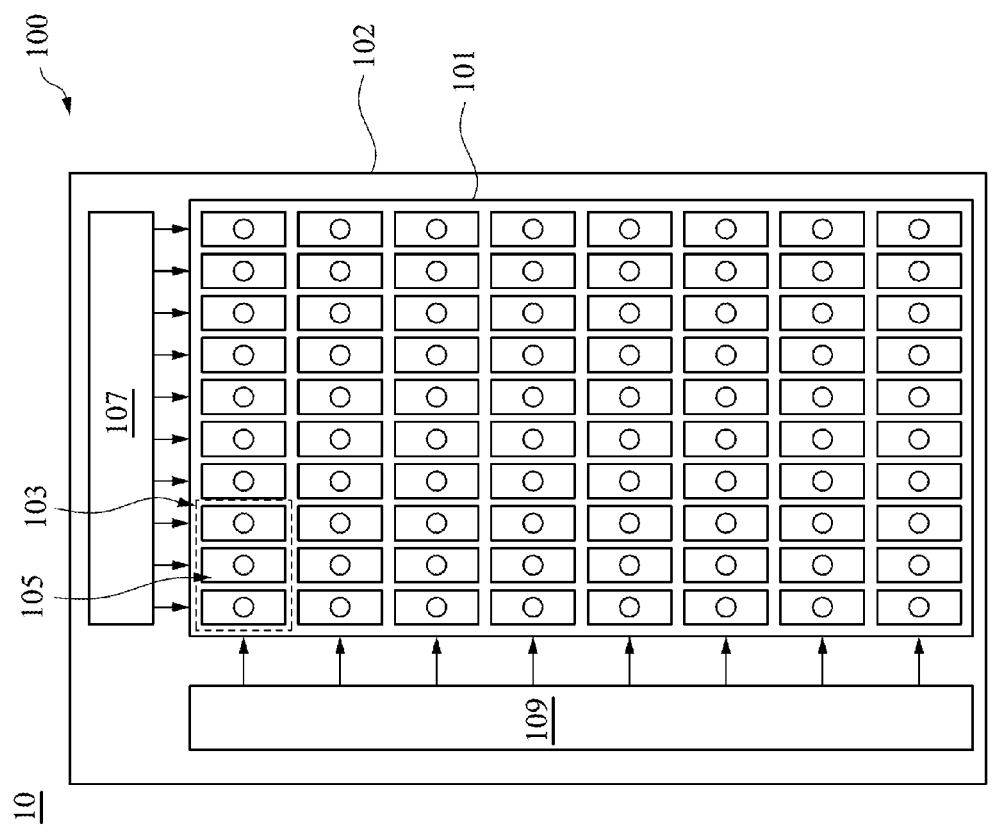
FIG. 1 is a top view of an LED display in accordance with a first embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
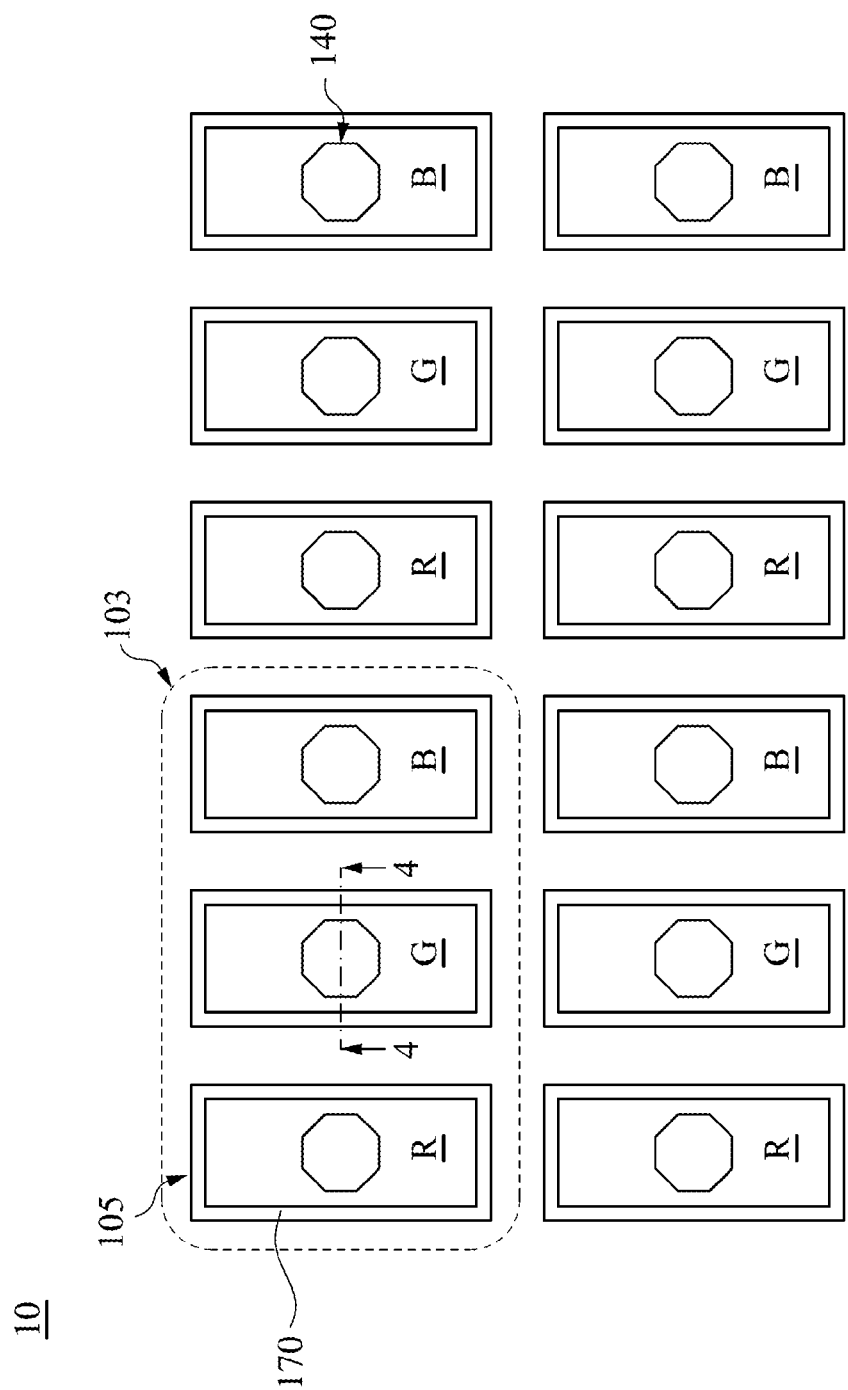
FIG. 2 is a partial enlarged view of FIG. 1.
Figure 3:
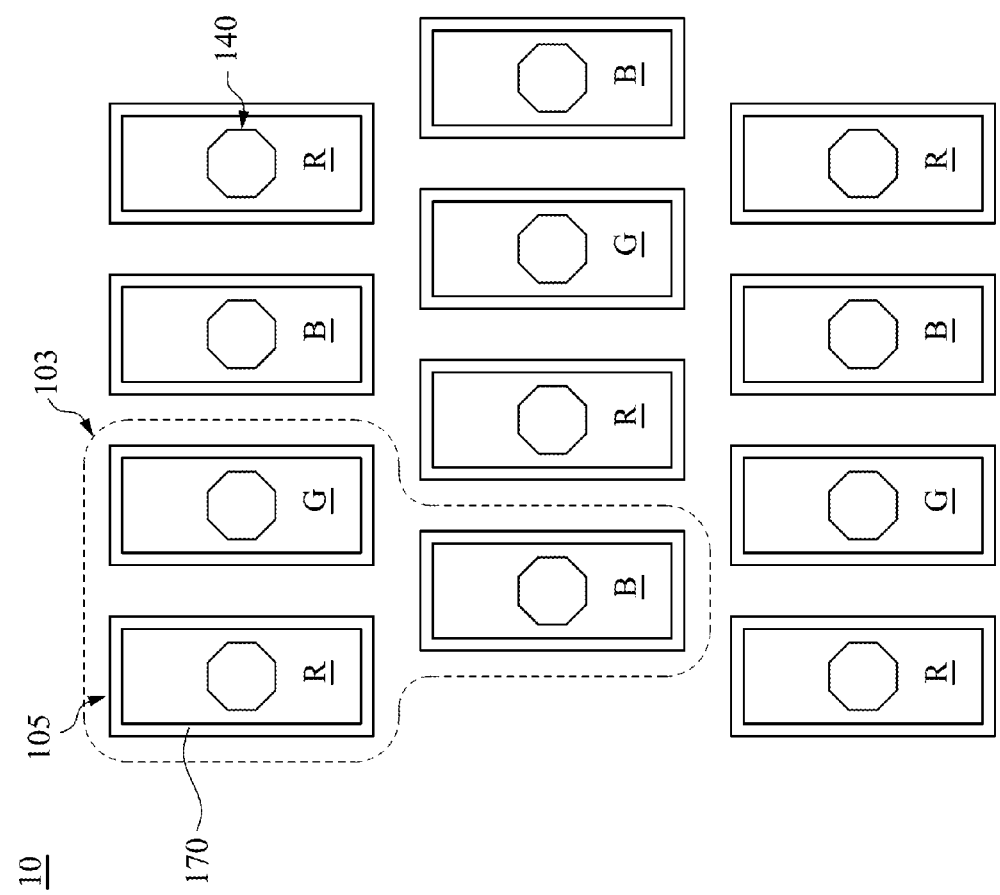
FIG. 3 is a partial enlarged view of an LED display in accordance with an embodiment of the present invention, in which sub-pixels have a delta type arrangement.

FIG. 1 is a top view of an LED display 10 in accordance with a first embodiment of the present invention. FIG. 2 is a partial enlarged view of FIG. 1. As shown in FIG. 1 and FIG. 2, an LED display 10 is provided. The LED display 10 includes a substrate 100 supporting a pixel area 101 and a non-pixel area 102 outside of the pixel area 101. The pixel area 101 includes pixel units 103 and sub-pixels 105 arranged in a matrix. As shown in FIG. 2, the sub-pixels 105 of the present embodiment have a strip type arrangement. Furthermore, the sub-pixels 105 may include a red, green, and blue sub-pixels R, G and B, and the red, green, and blue sub-pixels R, G and B are arranged along the same direction. However, the present invention is not limited to this regard. In other embodiments, the sub-pixels 105, e.g. the red, green, and blue sub-pixels R, G and B, may have a delta type arrangement, a rectangular type arrangement, or a mosaic type arrangement. As illustrated in FIG. 3, FIG. 3 is a partial enlarged view of an LED display in accordance with an embodiment of the present invention, in which the sub-pixels 105, e.g. the red, green, and blue sub-pixels R, G and B, have a delta type arrangement. In some embodiments, the sub-pixels 105 may further include a yellow sub-pixel (not shown), arranged in a RYGB configuration. In some embodiments, the sub-pixels 105 may further include a cyan sub-pixel (not shown), arranged in a RGCyB configuration. Furthermore, in some embodiments, the sub-pixels 105 may further include yellow and cyan sub-pixels, arranged in a RGBYCy configuration.

As shown in FIG. 1, the non-pixel area 102 includes a data driver circuit 107 connected to a data line of each sub-pixel 105 to enable data signals to be transmitted to the sub-pixels 105, and a scan driver circuit 109 connected to scan lines of the sub-pixels 105 to enable scan signals to be transmitted to the sub-pixels 105.

Figure 4:
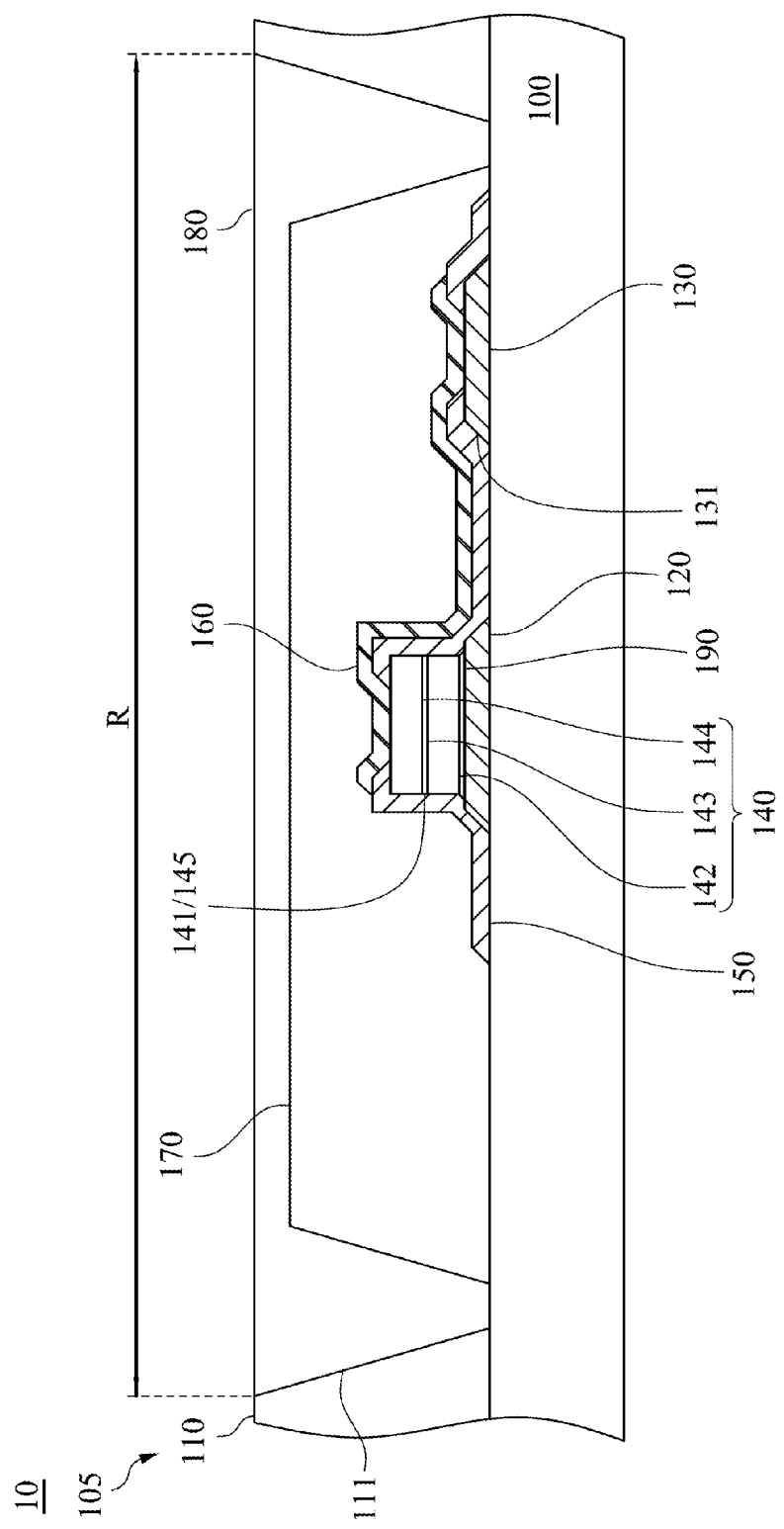
FIG. 4 is a cross-sectional view of FIG. 2 taken along line 4.

FIG. 4 is a cross-sectional view of FIG. 2 taken along line 4. As shown in FIG. 4, the LED display 10 includes a first bottom electrode 120, a second bottom electrode 130, a micro light emitting device 140, a first isolation layer 150, an opposite electrode 160, and an encapsulation layer 170, and may optionally include a pixel defining layer 110 and a protecting layer 180. The pixel defining layer 110, the first bottom electrode 120, the second bottom electrode 130, the micro light emitting device 140, the first isolation layer 150, the opposite electrode 160, and the encapsulation layer 170 are all disposed on the substrate 100.

The pixel defining layer 100 is configured to define areas of, for example, the red, green, and blue sub-pixels R, G and B, in which a color image can be displayed by the LED display 10 according to the combination of emissions of theses three types of sub-pixels 105. As shown in FIG. 4, the pixel defining layer 110 has an opening portion 111. The first bottom electrode 120, the second bottom electrode 130, the micro light emitting device 140, the first isolation layer 150, the opposite electrode 160, the encapsulation layer 170, and the protecting layer 180 are disposed inside the opening portion 111. In the present embodiment, the opening portion 111 defines a light emitting region R of the sub-pixel 105. As different colored light, for example, a red, green or blue colored light of micro light emitting device 140 is disposed inside the light emitting region R, the light emitting region R can thus emit the red, green or blue color, thereby forming the red, green and blue sub-pixels of the present embodiment.

As shown in FIG. 4, the micro light emitting device 140 is disposed on the first bottom electrode 120 and is electrically connected to the first bottom electrode 120. Furthermore, in the present embodiment, the LED display 10 may further includes an conductive layer 190 disposed between the micro light emitting device 140 and the first bottom electrode 120. The conductive layer 190 is configured to fix the micro light emitting device 140 to the first bottom electrode 120, and the conductive layer 190 is made of conductive material so that the micro light emitting device 140 is electrically connected-to the first bottom electrode 120. Alternatively, in some embodiments, the micro light emitting device 140 is directly bonded to the first bottom electrode 120, and the conductive layer 190 can be omitted.

As shown in FIG. 4, the first isolation layer 150 at least covers the side surface 141 of the light emitting device 140, in which the first isolation layer 150 has a refractive index $n_1$, the micro light emitting device 140 has a refractive index $n_{device}$, the outside medium has a refractive index $n_{air}$, and $n_{device} \geq n_1 \geq n_{air}$. More specifically, the refractive index $n_{device}$ is ranged from 2.0 to 2.6, and the refractive index $n_1$ is ranged from 1.2 to 2.5. Since the refractive index $n_1$ of the first isolation layer 150 is less than or equal to the refractive index $n_{device}$ of the micro light emitting device 140 and is larger than or equal to the refractive index $n_{air}$ of the outside medium, the total internal reflection on the contacted interface between the first isolation layer 150 and the side surface 141 of the micro light emitting device 140 can be reduced, thereby enhancing the light extraction efficiency of the micro light emitting device 140. Furthermore, since the refractive indexes gradually decreases from the micro light emitting device 140 to the outside medium, the light extraction efficiency of the micro light emitting device 140 can be improved.

As shown in FIG. 4, the opposite electrode 160 is disposed on the micro light emitting device 140 and is electrically connected to the micro light emitting device 140 and the second bottom electrode 130, in which the first bottom electrode 120 and the second bottom electrode 130 are separated and insulated from each other. In the present embodiment, the first isolation layer 150 covers the side surface 141 of the light emitting device 140 and also covers the side surface 131 of the second bottom electrode 130. In other words, the first isolation layer 150 at least exposes a top portion of the micro light emitting device 140 and also exposes a top portion of the second bottom electrode 130. The opposite electrode 160 is disposed on the exposed top portion of the micro light emitting device 140 and on the exposed top portion of the second bottom electrode 130 so that the opposite electrode 160 is electrically connected to the micro light emitting device 140 and the second bottom electrode 130.

As shown in FIG. 4, the encapsulation layer 170 covers the micro light emitting device 140, the first isolation layer 150, the first bottom electrode 120, the second bottom electrode 130 and the opposite electrode 160. The light emitted from the micro light emitting device 140 can be uniformly scattered inside the encapsulation layer 170 so that the light is emitted from the light emitting region R of the sub-pixel 105. Furthermore, in some embodiments, the encapsulation layer 170 may include light diffusion particles distributed therein, so as to enhance the scattering of the light. In some embodiments, the encapsulation layer 170 directly covers the first isolation layer 150, and the opposite electrode 160. That is, there is a contacted interface between the encapsulation layer 170 and the first isolation layer 150 and between the encapsulation layer 170 and opposite electrode 160. In some embodiment, the encapsulation layer 170 has a refractive index $n_{encap}$, and $n_{device} \geq n_1 \geq n_{encap}$. More specifically, the refractive index $n_{encap}$ is ranged from 1.0 to 2.5. Since the refractive indexes gradually decrease from the micro light emitting device 140 to the outside medium, e.g. the first isolation layer 150 and the encapsulation layer 170, the light extraction efficiency of the micro light emitting device 140 can be improved.

As shown in FIG. 4, the protecting layer 180 covers the encapsulation layer 170. In the present embodiment, the protecting layer 180 is used to protect the whole micro light emitting package including the micro light emitting device 140, the first bottom electrode 120, the second bottom electrode 130, and the opposite electrode 160. In some embodiment, the protecting layer 180 has a refractive index $n_{prot}$, the outside medium has a refractive index $n_{air}$, and $n_{device} \geq n_1 \geq n_{encap} \geq n_{prot} \geq n_{air}$. More specifically, the refractive index $n_{prot}$ is ranged from 1.0 to 2.5. Since the refractive index $n_{encap}$ of the encapsulation layer 170 is less than or equal to the refractive index $n_1$ of the first isolation layer 150 and is larger than or equal to the refractive index $n_{prot}$ of the protecting layer 180, the total internal reflection on the contacted interface between the encapsulation layer 170 and the first isolation layer 150 can be reduced. Furthermore, since the refractive index $n_{prot}$ of the protecting layer 180 is less than or equal to the refractive index $n_{encap}$ of the encapsulation layer 170 and is larger than or equal to the refractive index $n_{air}$ of the outside medium, the total internal reflection on the contacted interface between the protecting layer 180 and the encapsulation layer 170 can be reduced. Furthermore, since the refractive indexes gradually decreases from the micro light emitting device 140 to the outside medium, e.g. the first isolation layer 150, the encapsulation layer 170, and the protecting layer 180, the light extraction efficiency of the micro light emitting device 140 can be improved.

It is noted that, in some embodiments, the encapsulation layer 170 can also protect the whole micro light emitting package and should therefore be understood that the protecting layer 180 may be optional.

Figure 5:
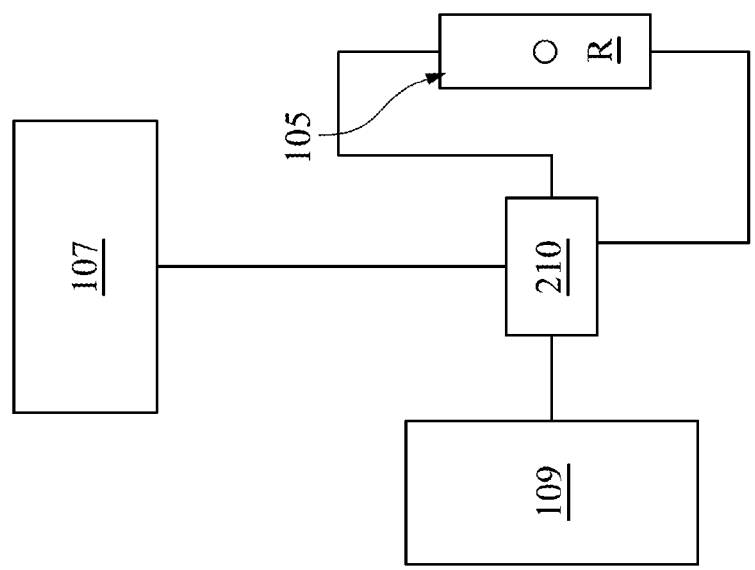
FIG. 5 is a schematic block diagram relative to a sub-pixel unit in accordance with an embodiment of the present invention.

Although not illustrated in FIGS. 1-4, it should be understood that the LED display 10 may further include a pixel circuit in each of the sub-pixel 105. More specifically, FIG. 5 is a schematic block diagram relative to a sub-pixel 105 in accordance with an embodiment of the present invention. With reference made to FIG. 4 and FIG. 5, the sub-pixels 105, e.g. the red sub-pixel R, is electrically connected to a pixel control circuit 210. The pixel control circuit 210 may include a working circuitry (not illustrated) formed on the substrate 100 relative to each of the sub-pixel 105. For example, the substrate 100 may be an active device array substrate, and the working circuitry may include a thin film transistor. The pixel control circuit 210 is electrically connected with the scan driving circuit 109, the data driving circuit 107 and the micro light emitting device 140 of each of the sub-pixels 105, so as to drive the emission of the micro light emitting device 140 through the data signals and the scan signals. In some embodiments, the substrate 100 may be a passive matrix display substrate.

Referring back to FIG. 4, in some embodiments, the micro light emitting device 140 is a vertical type micro LED. The size of the vertical type micro LED is less than the size of the sub-pixel 105. The size of the sub-pixel 105 depends on the geometric size and the resolution of the LED display 10. Furthermore, the vertical type micro LED includes a first type semiconductor layer 142, a second type semiconductor layer 144 and an active layer 143. The first type semiconductor layer 142 is electrically connected with the first bottom electrode 120. The second type semiconductor layer 144 is electrically connected with the opposite electrode 160. The active layer 143 is disposed between the first type semiconductor layer 142 and the second type semiconductor layer 144. When the vertical type micro LED is forward biased, the electrons and holes recombine in the active layer 143 and thus the active layer 143 emits the light. In the embodiment of FIG. 4, the first isolation layer 150 also covers the side surface 145 of the active layer 143, and the refractive index $n_1$ of the first isolation layer 150 is equal to or less than the refractive index of the active layer 143 and is larger than or equal to the refractive index $n_{encap}$ of the encapsulation layer 170. Therefore, when the light is emitted from the active layer 143, the total internal reflection on the contacted interface between the first isolation layer 150 and the active layer 143 can be reduced, thereby enhancing the light extraction efficiency of the micro light emitting device 140.

Furthermore, in some embodiments, the first type semiconductor layer 142 is a N-type semiconductor layer, and the second type semiconductor layer 144 is a P-type semiconductor layer. The first bottom electrode 120 that is electrically connected with the first type semiconductor layer 142 is a common electrode, and the second bottom electrode 130 that is electrically connected with the second type semiconductor layer 144 is a data electrode. The pixel control circuit 210 (illustrated in FIG. 5) is electrically connected with the first bottom electrode 120 and the second bottom electrode 130, so as to drive the micro light emitting device 140 to emit the light.

In some other embodiments, the first type semiconductor layer 142 is a P-type semiconductor layer, and the second type semiconductor layer 144 is a N-type semiconductor layer. The first bottom electrode 120 that is electrically connected with the first type semiconductor layer 142 is a data electrode, and the second bottom electrode 130 that is electrically connected with the second type semiconductor layer 144 is a common electrode. Similarly, the pixel control circuit 210 (illustrated in FIG. 5) is electrically connected with the first bottom electrode 120 and the second bottom electrode 130, so as to drive the micro light emitting device 140 to emit the light.

Figure 6:
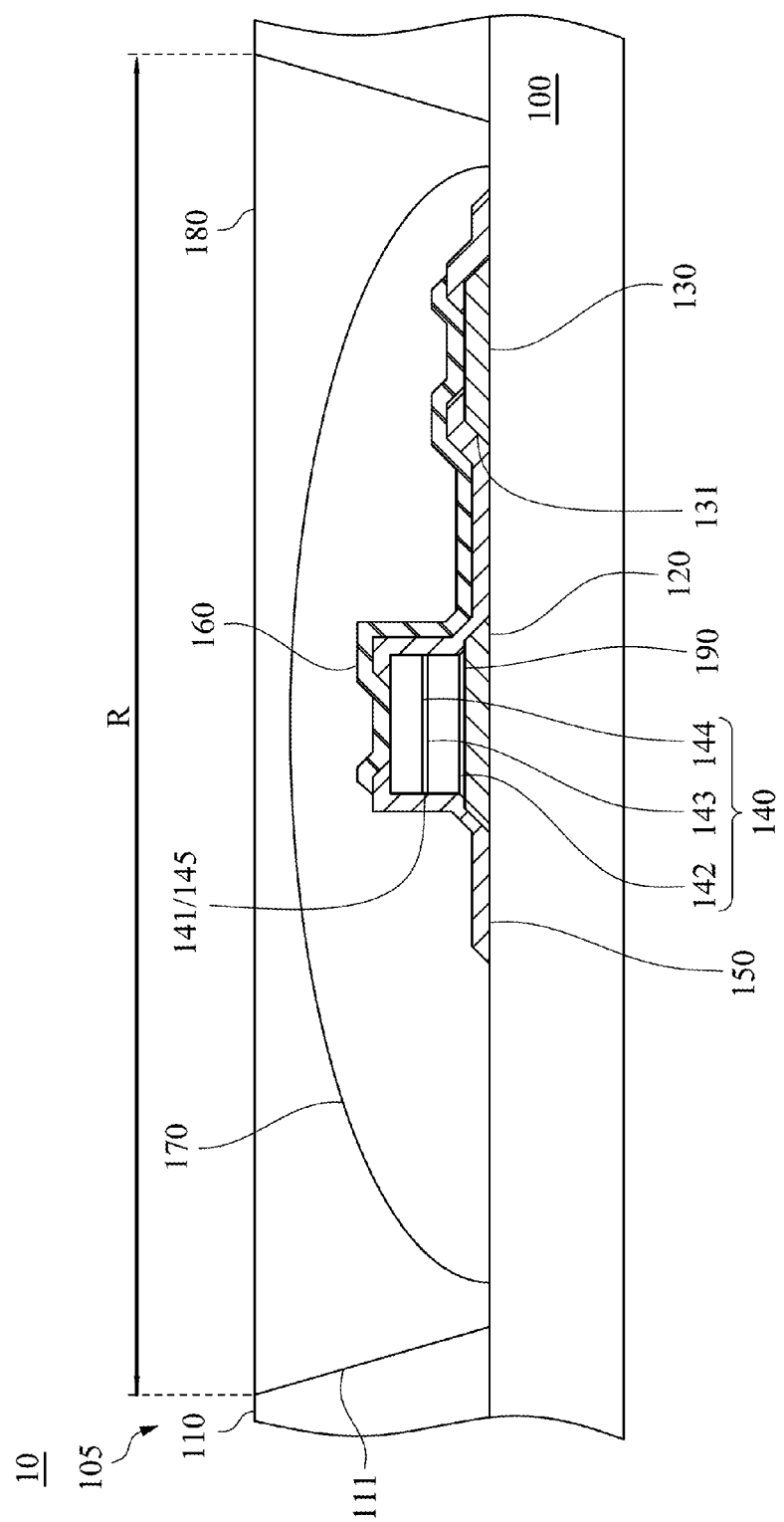
FIG. 6 is cross-sectional view of FIG. 2 in accordance with a second embodiment of the present invention, in which the position of the cross section is the same as in FIG. 4.

FIG. 6 is cross-sectional view of FIG. 2 in accordance with a second embodiment of the present invention, in which the position of the cross section is the same as in FIG. 4. FIG. 7 shows the optical path according to the embodiment of FIG. 4 and the embodiment of FIG. 6. As shown in FIG. 6, the difference between this embodiment and the first embodiment is that the encapsulation layer 170 of FIG. 6 has a convex arc-shaped surface. More specifically, the shape of the encapsulation layer 170 in the cross sectional view is approximately a semicircle or a semi-ellipse. As shown in FIG. 7, such convex arc-shaped surface can assist the light to illuminate toward a specific direction and may improve the light extraction efficiency as well. In other words, the encapsulation layer 170 in FIG. 6 can act as a collimator or a micro lens, thereby enhancing the luminance intensity of the LED display 10.

Figure 8:
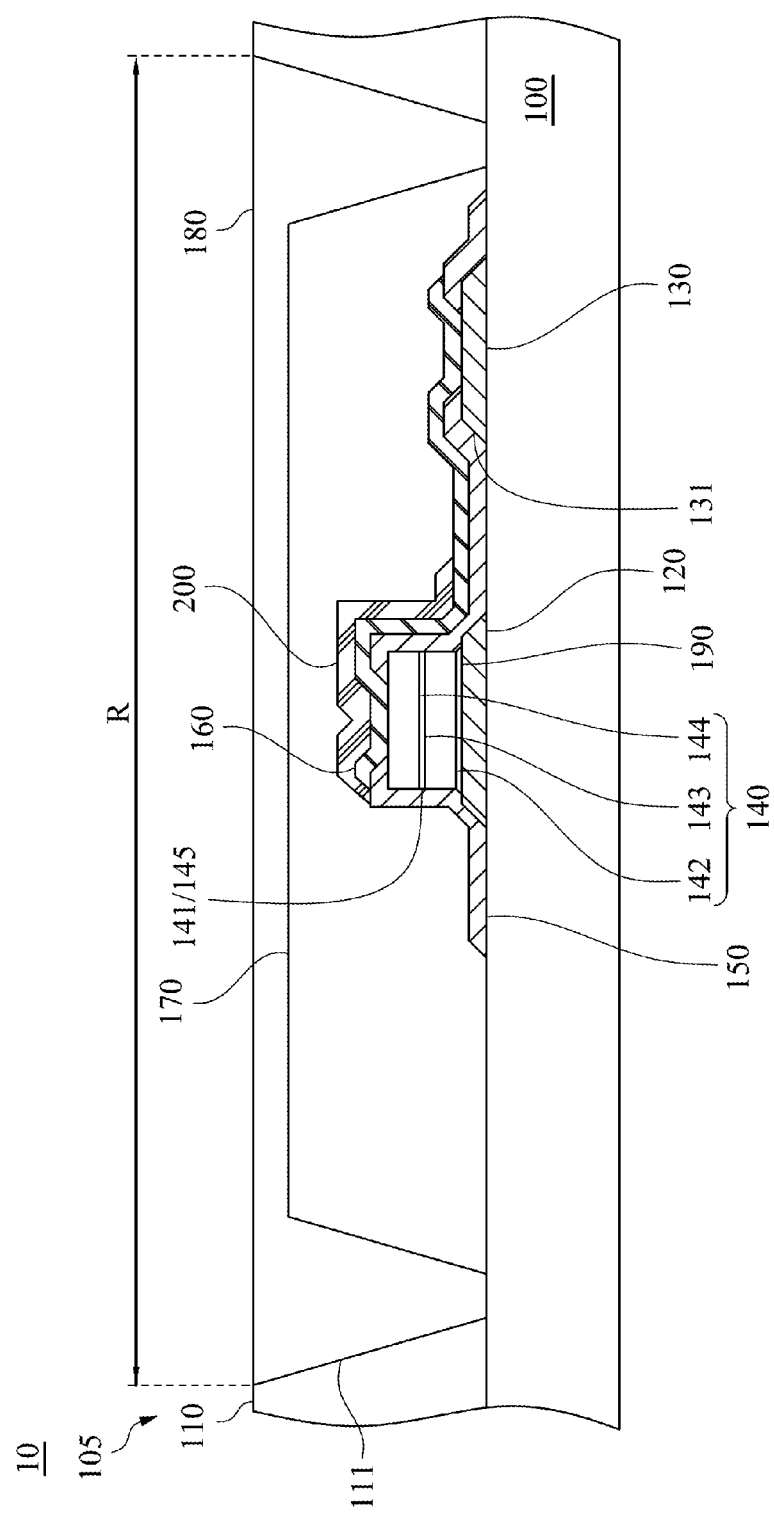
FIG. 8 is cross-sectional view of FIG. 2 in accordance with a third embodiment of the present invention, in which the position of the cross section is the same as in FIG. 4.

FIG. 8 is cross-sectional view of FIG. 2 in accordance with a third embodiment of the present invention, in which the position of the cross section is the same as in FIG. 4. As shown in FIG. 8, the difference between this embodiment and the first embodiment is that the LED display 10 of FIG. 8 further includes a second isolation layer 200. The second isolation layer 200 is disposed between the encapsulation layer 170 and the opposite electrode 160. Furthermore, the orthogonal projection of the second isolation layer 200 on the substrate 100 overlaps with the orthogonal projection of the micro light emitting device 140 on the substrate 100. In the present embodiment, the second isolation layer 200 at least partially covers on the first isolation layer 150. The second isolation layer 200 has a refractive index $n_2$, and the refractive index $n_2$ of the second isolation layer 200 is equal to or less than the refractive index $n_1$ of the first isolation layer 150 and is equal to or larger than the refractive index $n_{encap}$ of the encapsulation layer 170. Thus, the total internal reflection on the contacted interface between the first isolation layer 150 and the second isolation layer 200 can be reduced, thereby enhancing the light extraction efficiency of the micro light emitting device 140.

In more detail, in the embodiment of FIG. 8, the encapsulation layer 170 covers the second isolation layer 200, and the refractive index $n_{encap}$ is equal to or less than the refractive index $n_2$ of the second isolation layer 200 and is equal to or larger than the refractive index $n_{prot}$ of the protecting layer 180. Thus, the total internal reflection on the contacted interface between the second isolation layer 200 and the encapsulation layer 170 can be reduced. Furthermore, in the embodiment of FIG. 8, the refractive indexes gradually decreases from the micro light emitting device 140 to the outside medium, e.g. the first isolation layer 150, the second isolation layer 200, the encapsulation layer 170, and the protecting layer 180. Briefly speaking, the refractive indexes from the micro light emitting device 140 to the outside medium have the relationship of $n_{device} \geq n_1 \geq n_2 \geq n_{encap} \geq n_{prot} \geq n_{air}$. Thus, the total internal reflection between two adjacent layers can be reduced, and the light extraction efficiency of the micro light emitting device 140 can be improved.

Figure 9:
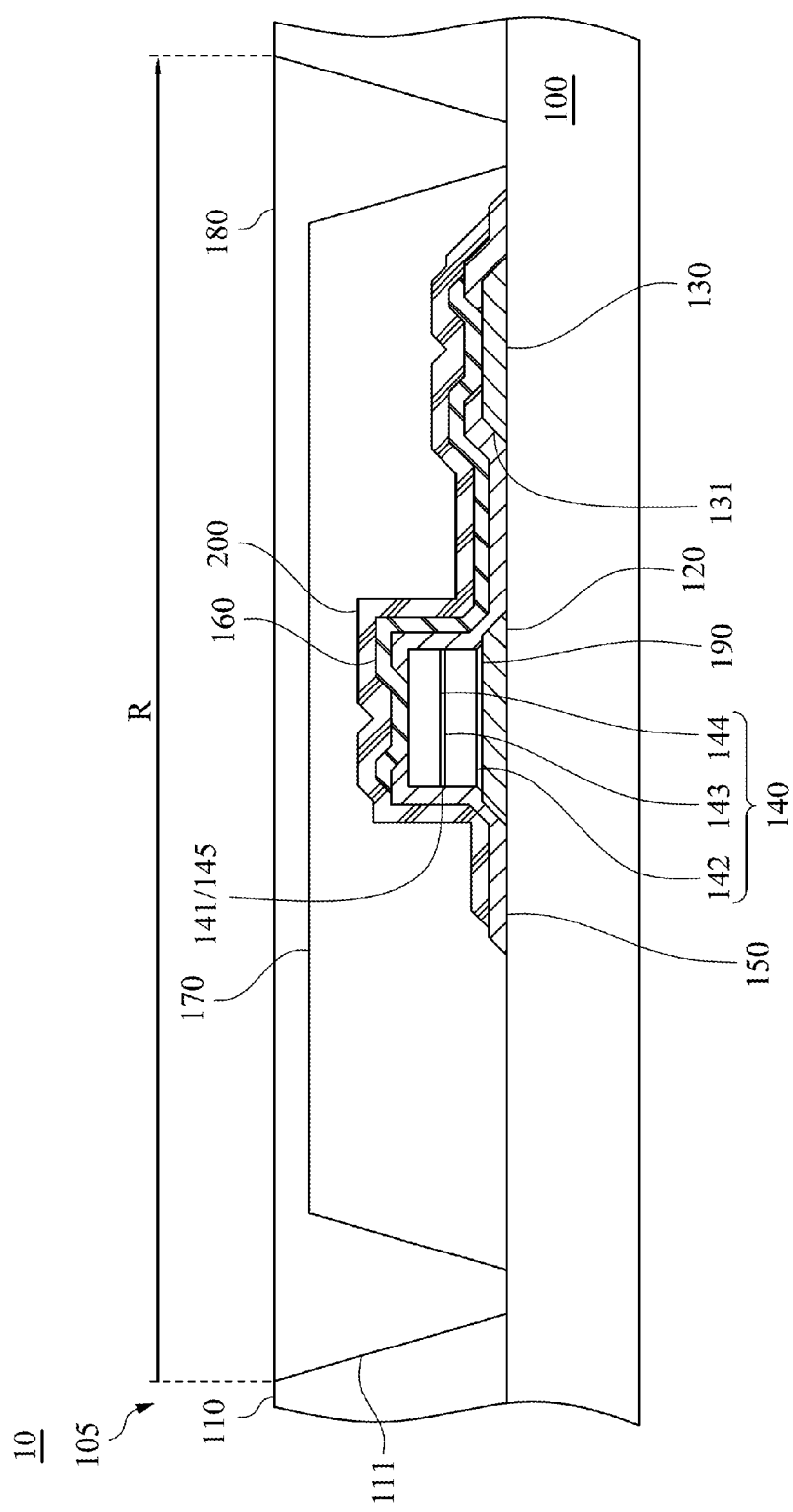
FIG. 9 is cross-sectional view of FIG. 2 in accordance with a fourth embodiment of the present invention, in which the position of the cross section is the same as in FIG. 4.

FIG. 9 is cross-sectional view of FIG. 2 in accordance with a fourth embodiment of the present invention, in which the position of the cross section is the same as in FIG. 4. As shown in FIG. 9, the difference between this embodiment and the third embodiment is that the second isolation layer 200 of FIG. 9 covers the first isolation layer 150 and also covers the side surface 141 of the micro light emitting device 140. More specifically, the second isolation layer 200 directly covers the first isolation layer 150 and indirectly covers the side surface 141 of the micro light emitting device 140. In other words, the portion of the first isolation layer 150 that directly covers the side surface 141 of the micro light emitting device 140 is also directly covered by the second isolation layer 200. Furthermore, the refractive indexes from the micro light emitting device 140 to the encapsulation layer 170 have the relationship of $n_{device} \geq n_1 \geq n_2 \geq n_{encap}$. Therefore, because the second isolation layer 200 is disposed between the first isolation layer 150 and the encapsulation layer 170, and the second isolation layer 200 has greater refractive index $n_2$ than the encapsulation layer 170 $n_{encap}$ and less refractive index $n_2$ than the first isolation layer 150 $n_1$, the total internal reflection can be further reduced in the present embodiment compared with the embodiment of FIG. 4 that does not have the second isolation layer 200 disposed between the first isolation layer 150 and the encapsulation layer 170.

It is should be understood that although not illustrated, the encapsulation layer 170 in FIGS. 8-9 may have a convex arc-shaped surface to illuminate the light toward a specific direction, so as to enhance the luminance intensity of the LED display 10. Furthermore, since the encapsulation layer 170 can also protect the whole micro light emitting package, the protecting layer 180 may be optional.

Figure 10:
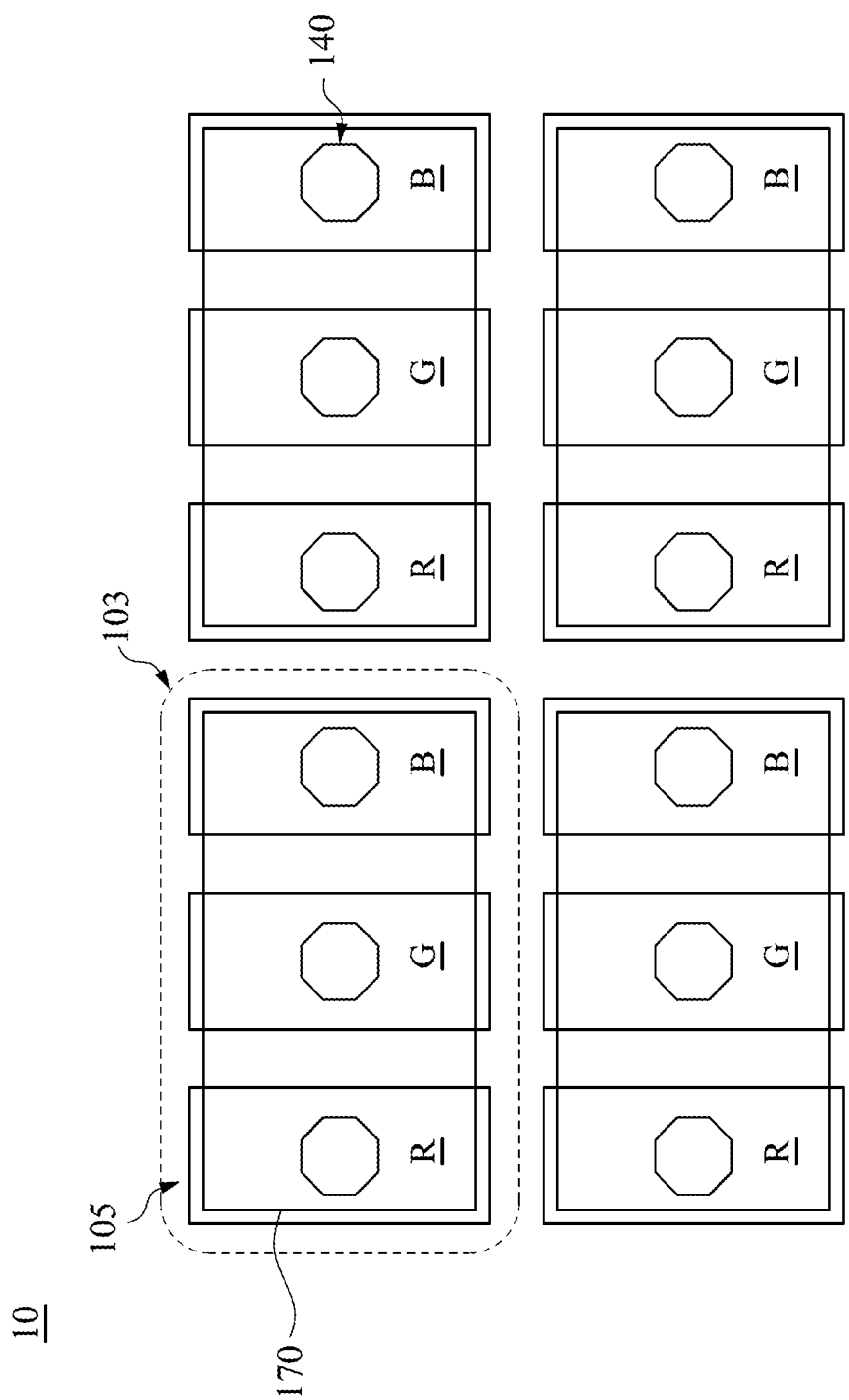
FIG. 10 is a partial enlarged view of FIG. 1 in accordance with another embodiment of the present invention.

FIG. 10 is a partial enlarged view of FIG. 1 in accordance with another embodiment of the present invention. The difference between the embodiment of FIG. 10 and the embodiment of FIG. 2 is that the encapsulation layer 170 of FIG. 10 covers the plurality of sub-pixels 105, and the encapsulation layer 170 of FIG. 2 covers just one sub-pixel 105. In other words, in FIG. 10, the red, green and blue sub-pixels R, G and B are covered by the same encapsulation layer 170, and in FIG. 2, the red, green and blue sub-pixels R, G and B are respectively covered by three separated encapsulation layers 170. AS a result, the embodiment of FIG. 8 may have better light mixing effect since the red, green and blue sub-pixels R, G and B shares the same encapsulation layer 170. Furthermore, the encapsulation layer 170 of FIG. 10 may include light diffusion particles distributed therein, so as to enhance the mixing of the light within the pixel unit 103.

Figure 11A:
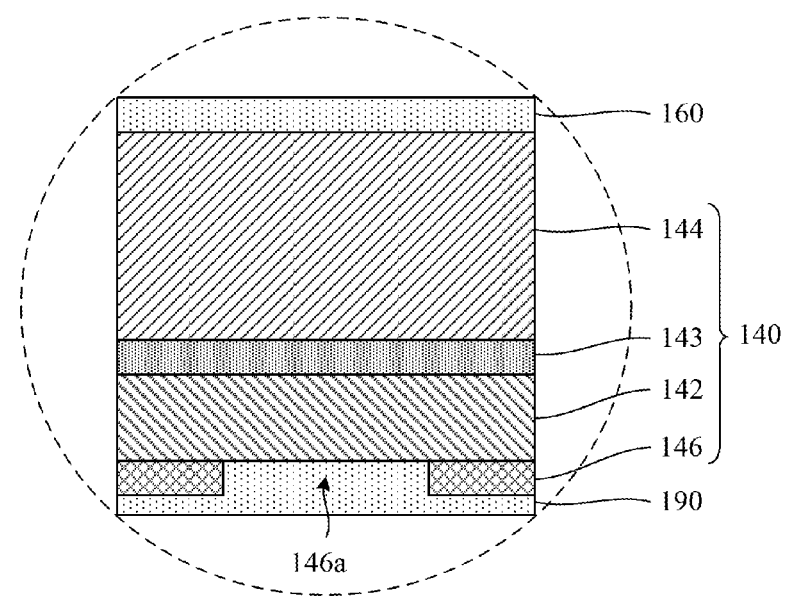
FIG. 11A an enlarged cross-sectional view of the micro light emitting device in FIG. 4 according to an embodiment of present invention.

FIG. 11A an enlarged cross-sectional view of the micro light emitting device 140 in FIG. 4 according to an embodiment of present invention. As shown in the FIG. 11A, the micro light emitting device 140 further includes a current controlling layer 146 having at least one opening 146a therein. The current controlling layer 146 is joined with the first type semiconductor layer 142. The conductive layer 190 is partially joined with the current controlling layer 146 and is electrically coupled with the exposed part of the first type semiconductor layer 142 through the opening 146a of the current controlling layer 146. The opening 146a of the current controlling layer 146 defines the contact area between the conductive layer 190 and the first type semiconductor layer 142. When the micro light emitting device 140 is forward biased, charge carriers flow from the contact area between the conductive layer 190 and the first type semiconductor layer 142 to the junction of the first type semiconductor layer 142 and the second type semiconductor layer 144 (i.e., the active layer 143).

The micro light emitting device 140 of the embodiment uses the current controlling layer 146 to limit the emitting area of the micro light emitting device 140. Since the opening 146 limits the area where the current goes into the micro light emitting device 140, the current density within the emitting area of the micro light emitting device 140 increases and can be uniform, thereby increasing the operating stability and efficiency of the micro light emitting device 140.

Furthermore, since the opening 146a of the current controlling layer 146 makes the emitting area of the micro light emitting device 140 smaller than the size of the micro light emitting device 140, it is possible to continue miniaturization of the emitting area of the micro light emitting device 140 while remain the size of the micro light emitting device 140 to be easier to handling in the manufacturing process.

Figure 11B:
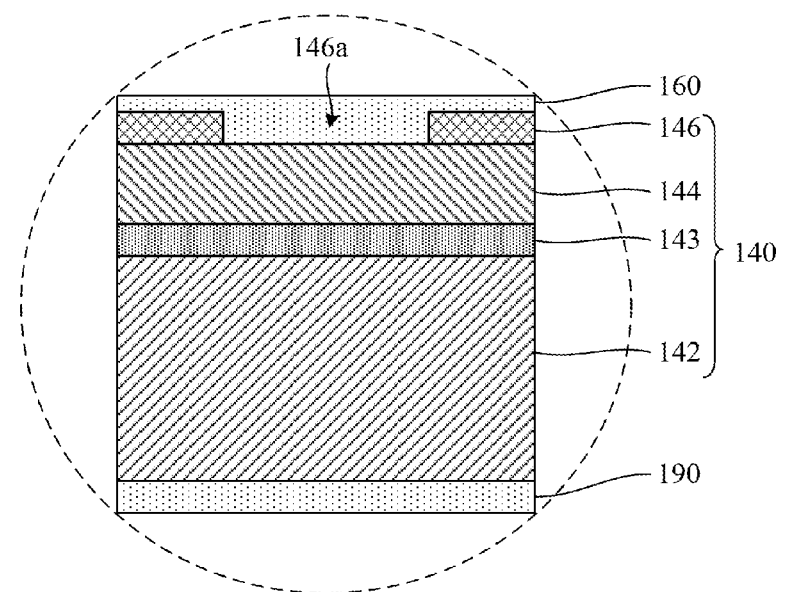
FIG. 11B an enlarged cross-sectional view of the micro light emitting device in FIG. 4 according to an embodiment of present invention.

FIG. 11B an enlarged cross-sectional view of the micro light emitting device in FIG. 4 according to an embodiment of present invention. As shown in the FIG. 11B, the difference between the micro light emitting device 140 of FIG. 11B and the micro light emitting device 140 of FIG. 11A is that the current controlling layer 146 of FIG. 11B is located at a side of the second type semiconductor layer 144 distal to the conductive layer 190. That is, the opening 146a of the current controlling layer 146 of FIG. 11B faces away from the substrate 100. Other details regarding the micro light emitting device 140 of FIG. 11B are similar to the micro light emitting device 140 of FIG. 11A and therefore are not repeated here to avoid duplicity.

Figure 11C:
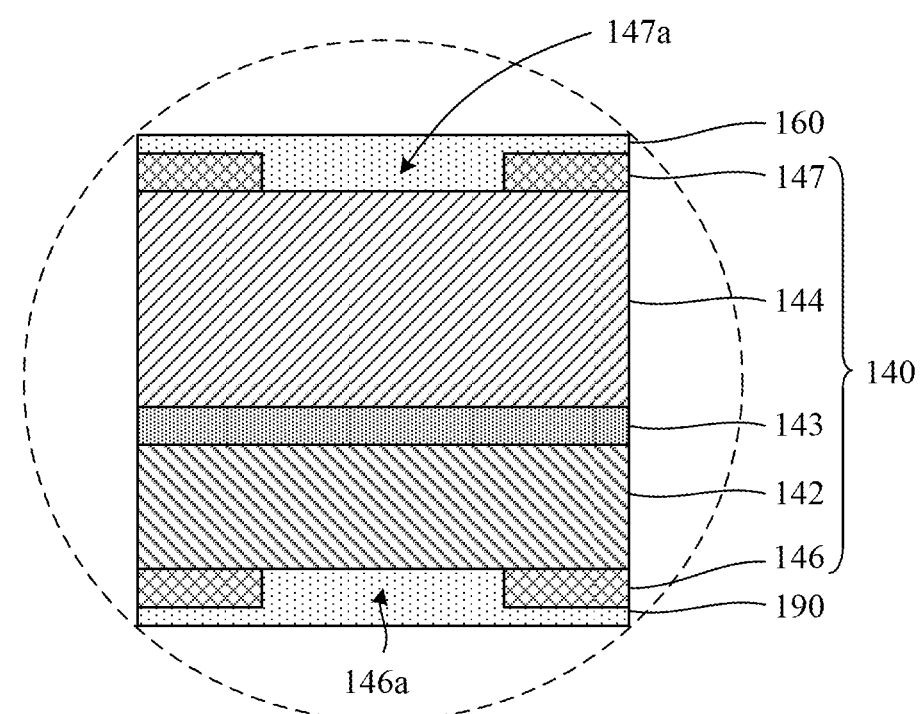
FIG. 11C an enlarged cross-sectional view of the micro light emitting device in FIG. 4 according to an embodiment of present invention.

FIG. 11C an enlarged cross-sectional view of the micro light emitting device in FIG. 4 according to an embodiment of present invention. As shown in the FIG. 11C, the difference between the micro light emitting device 140 of FIG. 11C and the micro light emitting device 140 of FIG. 11A is that the micro light emitting device 140 further includes the current controlling layer 147 located at a side of the second type semiconductor layer 144 distal to the conductive layer 190, in which the current controlling layer 147 has at least one opening 147a therein, and the opposite electrode 160 extends through the opening 147a of the current controlling layer 147 to be electrically coupled with the second type semiconductor layer 144. That is, the opening 147a of the current controlling layer 147 of FIG. 11C faces away from the substrate 100. Other details regarding the micro light emitting device 140 of FIG. 11C are similar to the micro light emitting device 140 of FIG. 11A and therefore are not repeated here to avoid duplicity.

Figure 11D:
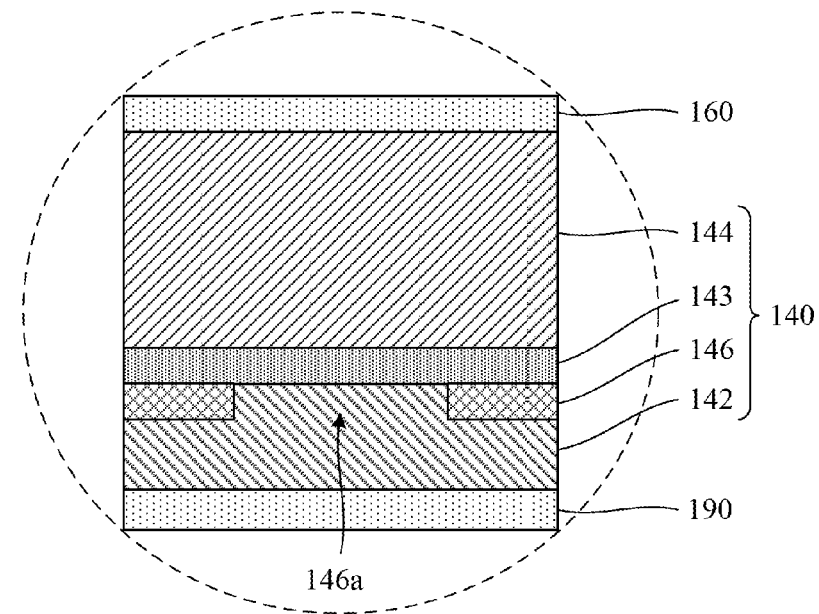
FIG. 11D an enlarged cross-sectional view of the micro light emitting device in FIG. 4 according to an embodiment of present invention.

FIG. 11D an enlarged cross-sectional view of the micro light emitting device in FIG. 4 according to an embodiment of present invention. As shown in the FIG. 11D, the difference between the micro light emitting device 140 of FIG. 11D and the micro light emitting device 140 of FIG. 11A is that the current controlling layer 146 of FIG. 11D is disposed between the first type semiconductor layer 142 and the active layer 143, and the current controlling layer 146 contacts the active layer 143. Other details regarding the micro light emitting device 140 of FIG. 11D are similar to the micro light emitting device 140 of FIG. 11A and therefore are not repeated here to avoid duplicity.

Figure 11E:
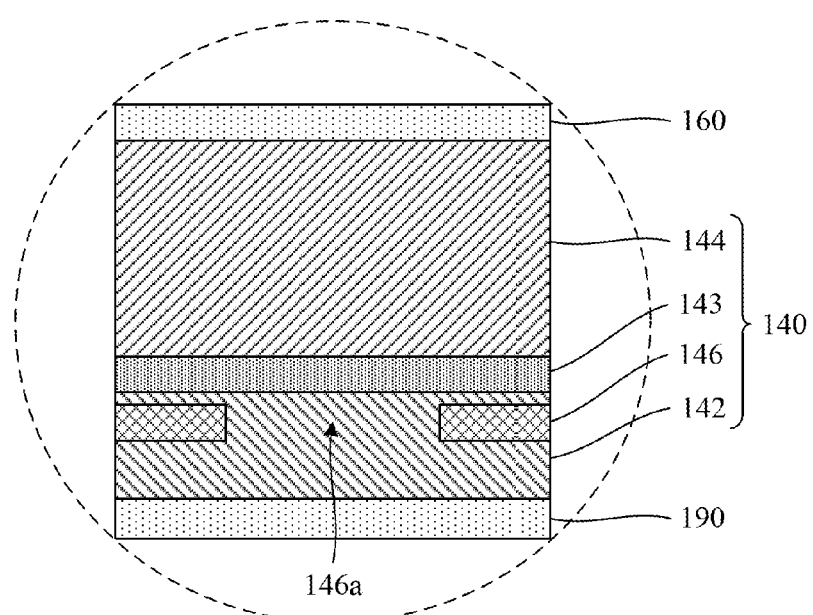
FIG. 11E an enlarged cross-sectional view of the micro light emitting device in FIG. 4 according to an embodiment of present invention.

FIG. 11E an enlarged cross-sectional view of the micro light emitting device in FIG. 4 according to an embodiment of present invention. As shown in the FIG. 11E, the difference between the micro light emitting device 140 of FIG. 11E and the micro light emitting device 140 of FIG. 11D is that the current controlling layer 146 of FIG. 11E is disposed in the first type semiconductor layer 142 without contacting the active layer 143. In this configuration, the first type semiconductor layer 142 may protect the active layer 143 while manufacturing the current controlling layer 146. Other details regarding the micro light emitting device 140 of FIG. 11E are similar to the micro light emitting device 140 of FIG. 11D and therefore are not repeated here to avoid duplicity.

Figure 11F:
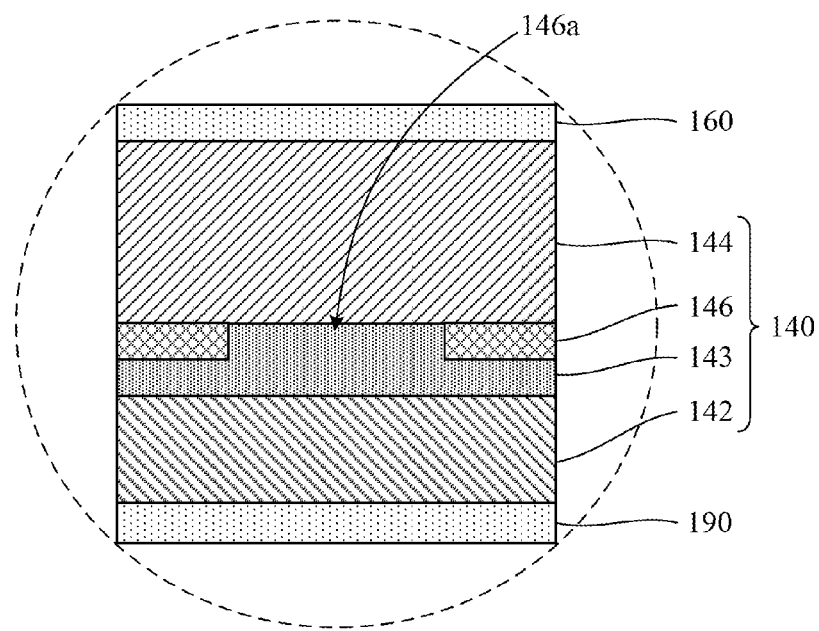
FIG. 11F an enlarged cross-sectional view of the micro light emitting device in FIG. 4 according to an embodiment of present invention.

FIG. 11F an enlarged cross-sectional view of the micro light emitting device in FIG. 4 according to an embodiment of present invention. As shown in the FIG. 11F, the differences between the micro light emitting device 140 of FIG. 11F and the micro light emitting device 140 of FIG. 11A are that the current controlling layer 146 of FIG. 11F is disposed between the active layer 143 and the second type semiconductor layer 144, and the current controlling layer 146 contacts the active layer 143. Other details regarding the micro light emitting device 140 of FIG. 11F are similar to the micro light emitting device 140 of FIG. 11A and therefore are not repeated here to avoid duplicity.

Figure 11G:
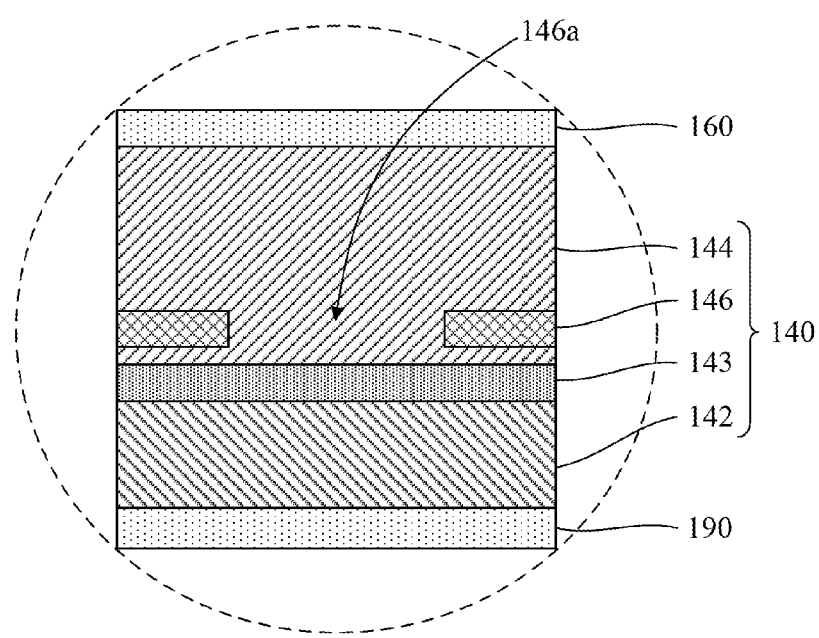
FIG. 11G an enlarged cross-sectional view of the micro light emitting device in FIG. 4 according to an embodiment of present invention.

FIG. 11G an enlarged cross-sectional view of the micro light emitting device in FIG. 4 according to an embodiment of present invention. As shown in FIG. 11G, the difference between the micro light emitting device 140 of FIG. 11G and the micro light emitting device 140 of FIG. 11F is that the current controlling layer 146 of FIG. 11G is disposed in the second type semiconductor layer 144 without contacting the active layer 143. Other details regarding the micro light emitting device 140 of FIG. 11G are similar to the micro light emitting device 140 of FIG. 11F and therefore are not repeated here to avoid duplicity.

Figure 11H:
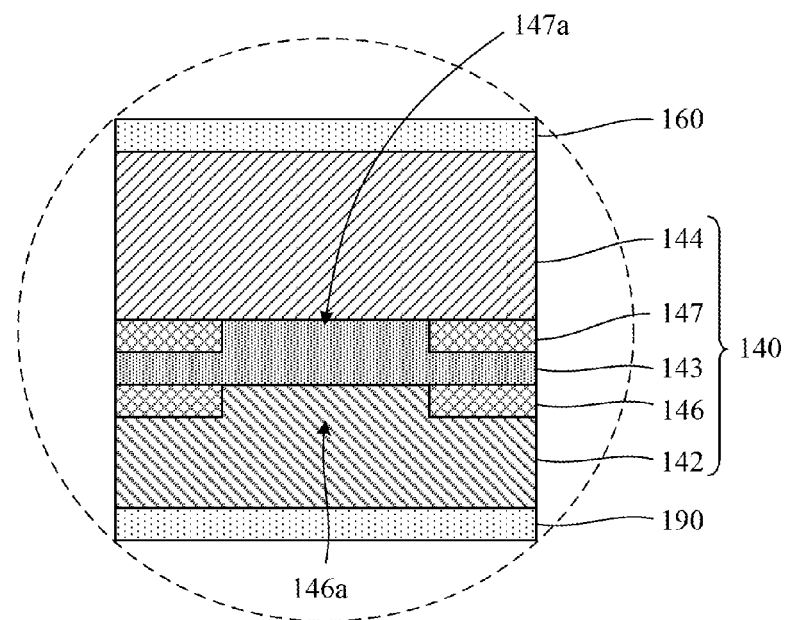
FIG. 11H an enlarged cross-sectional view of the micro light emitting device in FIG. 4 according to an embodiment of present invention.

FIG. 11H an enlarged cross-sectional view of the micro light emitting device in FIG. 4 according to an embodiment of present invention. As shown in FIG. 11H, the difference between the micro light emitting device 140 of FIG. 11H and the micro light emitting device 140 of FIG. 11D is that the micro light emitting device 140 of FIG. 11H further includes a current controlling layer 147 having at least one 147a therein. The current controlling layer 147 is disposed between the active layer 143 and the second type semiconductor layer 144. That is, the current controlling layers 146 and 147 are respectively located at opposite sides of the active layer 143. Other details regarding the micro light emitting device 140 of FIG. 11H are similar to the micro light emitting device 140 of FIG. 11D and therefore are not repeated here to avoid duplicity.

Figure 11I:
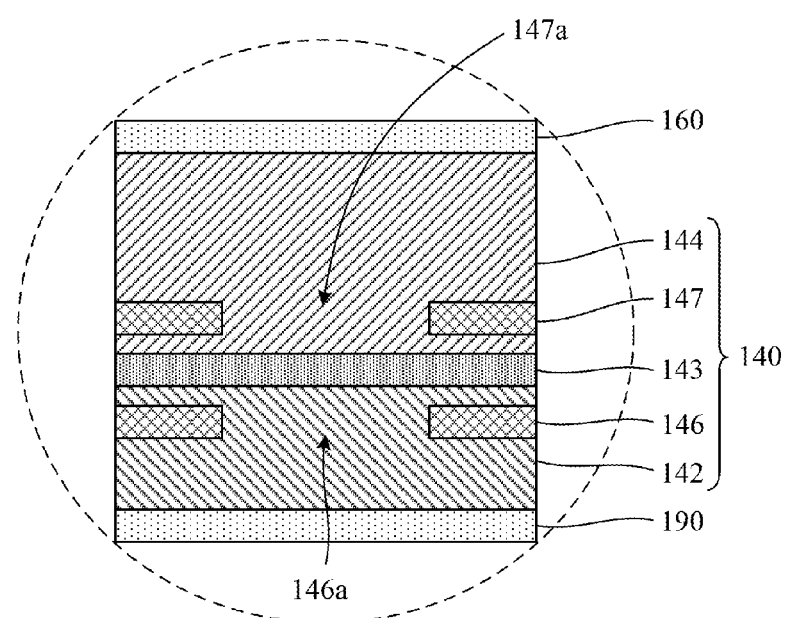
FIG. 11I an enlarged cross-sectional view of the micro light emitting device in FIG. 4 according to an embodiment of present invention.

FIG. 11I an enlarged cross-sectional view of the micro light emitting device in FIG. 4 according to an embodiment of present invention. As shown in FIG. 11I, the differences between the micro light emitting device 140 of FIG. 11I and the micro light emitting device 140 of FIG. 11D are that the current controlling layer 160 of FIG. 11I is disposed in the first type semiconductor layer 142 without contacting the active layer 143 and the current controlling layer 147 which has at least one 147a of FIG. 11I is disposed in the second type semiconductor layer 144 without contacting the active layer 143. In this configuration, the first type semiconductor layer 142 may protect the active layer 143 while manufacturing the current controlling layer 146. Other details regarding the micro light emitting device 140 of FIG. 11I are similar to the micro light emitting device 140 of FIG. 11H and therefore are not repeated here to avoid duplicity.

In some embodiments, only one of the current controlling layers 146 and 147 is formed to contact the active layer 143, and the other one of the current controlling layers 146 and 147 is formed without contacting the active layer 143.

Figure 12:
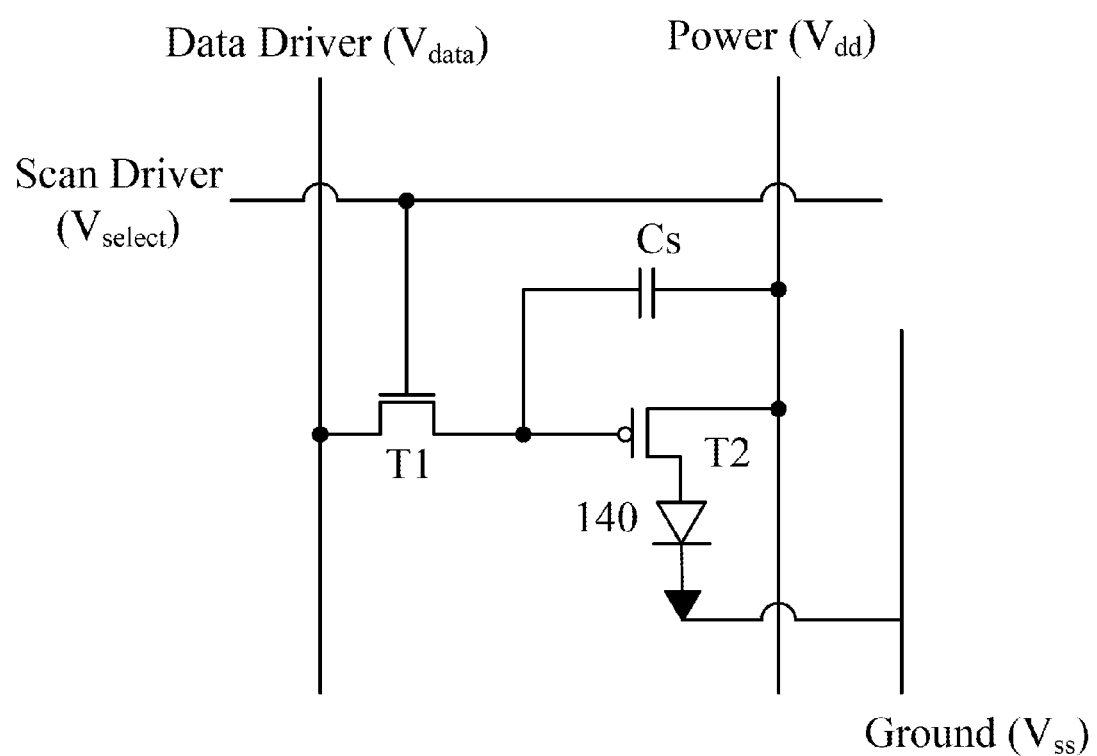
FIG. 12 is a circuit diagram of a sub-pixel unit with 2T1C circuitry in an active matrix display according to an embodiment of present invention.

FIG. 12 is a circuit diagram of a sub-pixel unit with 2T1C circuitry in an active matrix display according to an embodiment of present invention. In such an embodiment, the circuit can be used in the substrate 100 illustrated in FIG. 4, FIG. 6, FIG. 8, or FIG. 9, which makes the substrate 100 become an active matrix display substrate. The circuit includes a switching transistor T1, a driving transistor T2, a storage capacitor Cs, and a micro light emitting device 140. The transistors T1, T2 can be any type of transistor such as a thin film transistor. For example, the switching transistor T1 can be an n-type metal-oxide semiconductor (NMOS) transistor, and the driving transistor T2 can be a p-type metal-oxide semiconductor (PMOS) transistor. The switching transistor T1 has a gate electrode connected to a scan line $V_{select}$ and a first source/drain electrode connected to a data line $V_{data}$. The driving transistor T2 has a gate electrode connected to a second source/drain electrode of the switching transistor T1 and a first source/drain electrode connected to a power source $V_{dd}$. The storage capacitor Cs is connected between the gate electrode of the driving transistor T2 and the first source/drain electrode of the driving transistor T2. The micro light emitting device 140 has an anode electrode connected to a second source/drain electrode of the driving transistor T2 and a cathode electrode connected to a ground $V_{ss}$.

In operation, a voltage level scan signal turns on the switching transistor T1, which enables the data signal to charge the storage capacitor Cs. The voltage potential that stores within the storage capacitor Cs determines the magnitude of the current flowing through the driving transistor T2, so that the micro light emitting device 140 can emit light based on the current. It is to be appreciated that the 2T1C circuitry is meant to be exemplary, and that other types of circuitry or modifications of the traditional 2T1C circuitry (e.g., a 6T2C circuitry) are contemplated in accordance with embodiments of the invention. For example, more complicated circuits can be used to compensate for current distribution to the driver transistor and the micro device, or for their instabilities.

Figure 13:
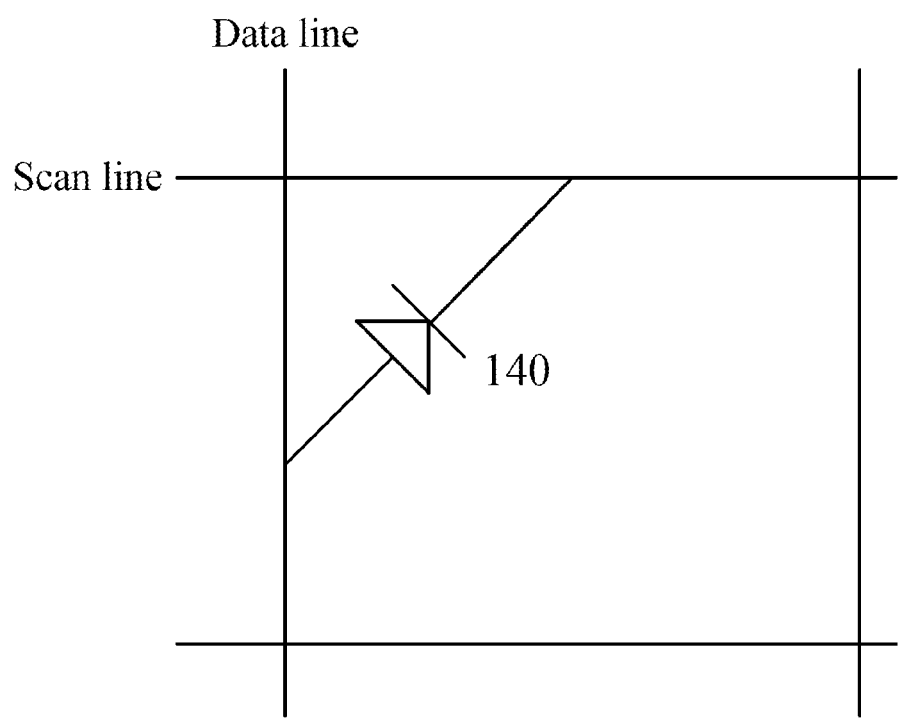
FIG. 13 is a circuit diagram of a sub-pixel unit according to an embodiment of present invention.

FIG. 13 is a circuit diagram of a sub-pixel unit according to an embodiment of present invention. In such an embodiment, the circuit used in the substrate 100 makes the substrate 100 become a passive matrix display substrate.

Next, the manufacturing method of the LED display 10 is disclosed in the following embodiments. The manufacturing method includes the following steps:

Step 1: providing a substrate;

Step 2: forming a first and a second bottom electrodes on the substrate;

Step 3: disposing a micro light emitting device on the first bottom electrode;

Step 4: forming a first isolation layer with contact holes;

Step 5: forming an opposite electrode on the micro light emitting device and on the second bottom electrode; and Step 6: forming an encapsulation layer.

With reference made to FIG. 4 to FIG. 7, in step 1, the substrate 100 may be made of material such as plastic or glass.

In step 2, the bottom electrode may refer to the first bottom electrode 120 and/or the second bottom electrode 130 shown in FIG. 4 to FIG. 7. Furthermore, in some embodiment, the first bottom electrode 120 and the second bottom electrode 130 are formed in the same process. The first bottom electrode 120 and the second bottom electrode 130 may include a metallic film or metal particles.

In step 3, the micro light emitting device 140 may be bonded on the first bottom electrode 120 through the conductive layer 190. The conductive layer 190 may be coated onto the first bottom electrode 120 or onto the micro light emitting device 140 before the micro light emitting device 140 is disposed on the first bottom electrode 120. In a specific example, the conductive layer 190 may be made of material such as conductive adhesives or metal alloy, and the micro light emitting device 140 may be a vertical type micro LED, but the present invention is not limited to this regard.

In step 4, the first isolation layer 150 covers at least the side surface 141 of the micro light emitting device 140. In a specific example, the first isolation layer 150 may be made of material such as composite polymer (polymer matrix with high refractive index material such as TiO2 or ZrO2 nanoparticles, for example), in which the first isolation layer 150 may have the refractive index $n_1$ ranged from 1.2 to 2.5, and the micro light emitting device 140 has a refractive index $n_{device}$ ranged from 2.0 to 2.6. The refractive index $n_1$ of the first isolation layer 150 is less than or equal to the refractive index $n_{device}$ of the micro light emitting device 140 and is larger than or equal to the refractive index of the an outer layer (i.e., the encapsulation layer 170), so as to reduce the total internal reflection between the contacted interface of the first isolation layer 150 and the side surface 141 of the micro light emitting device 140.

In step 5, the opposite electrode 160 is made of transparent conductive materials including transparent conductive oxides (TCO) such as indium-tin-oxide (ITO) and indium-zinc-oxide (IZO). As shown in FIG. 4 to FIG. 7, the opposite electrode 160 is also disposed on the second bottom electrode 130 so that the opposite electrode 160 is electrically connected between the micro light emitting device 140 and the second bottom electrode 130.

In step 6, the encapsulation layer 170 may at least cover the micro light emitting device 140 and the first isolation layer 150. In a specific example, the encapsulation layer 170 is made of material such as PMMA, epoxy or composite polymer, and the encapsulation layer 170 has a refractive index $n_{encap}$ ranged from 1.0 to 2.5. Since the refractive indexes gradually decreases from the micro light emitting device 140 to the first isolation layer 150 and the encapsulation layer 170, the light extraction efficiency of the micro light emitting device 140 can be improved.

In some embodiment, the encapsulation layer 170 can apply thermal reflowing to form a convex arc-shaped surface so that the encapsulation layer 170 of the present embodiment can act as a collimator or a micro lens, thereby enhancing the luminance intensity of the LED display 10.

In some embodiment, before forming the encapsulation layer 170, the manufacturing method further comprises:

Step 5.5: forming a second isolation layer 200.

Furthermore, the second isolation layer 200 at least covers the first isolation layer 150 and the side surface 141 of the micro light emitting device 140. More specifically, the second isolation layer 200 is performed after forming the opposite electrode 160. The second isolation layer 200 is disposed between the encapsulation layer 170 and the opposite electrode 160. In a specific example, the second isolation layer 200 is made of material such as composite polymer (polymer with high refractive index materials nanoparticle), in which the refractive index $n_2$ of the second isolation layer 200 is ranged from 1.0 to 2.5. Since the refractive index $n_2$ of the second isolation layer 200 is equal to or less than the refractive index $n_1$ of the first isolation layer 150 and is equal to or larger than the refractive index $n_{encap}$ of the encapsulation layer 170, the total internal reflection between the first isolation layer 150 and the second isolation layer 200 can be reduced. Furthermore, the refractive indexes from the micro light emitting device 140 to the second isolation layer 200 have the relationship of $n_{device} \geq n_1 \geq n_2 \geq n_{encap}$, and thus, the total internal reflection between two adjacent layers can be reduced, the light extraction efficiency of the micro light emitting device 140 can be improved.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A light emitting diode (LED) display, comprising:
   a substrate;
   a first bottom electrode and a second bottom electrode disposed on the substrate;
   a micro light emitting device disposed on the first bottom electrode and electrically connected to the first bottom electrode;
   a first isolation layer at least partially covering a side surface of the micro light emitting device, wherein the first isolation layer has a refractive index $n_1$, the micro light emitting device has a refractive index $n_{device}$, and $n_{device} \geq n_1$;
   an opposite electrode disposed on the micro light emitting device and electrically connected to the micro light emitting device and the second bottom electrode; and
   an encapsulation layer at least covering the micro light emitting device and the first isolation layer.

2. The LED display of claim 1, wherein the encapsulation layer has a refractive index $n_{encap}$, and $n_{device} \geq n_1 \geq n_{encap}$.

3. The LED display of claim 1, wherein the encapsulation layer has a convex arc-shaped surface.

4. The LED display of claim 1, further comprising:
   a second isolation layer disposed between the encapsulation layer and the opposite electrode and an orthogonal projection of the second isolation layer on the substrate overlapping with an orthogonal projection of the micro light emitting device on the substrate, wherein the second isolation layer has a refractive index $n_2$, and $n_{device} \geq n_1 \geq n_2 \geq n_{encap}$.

5. The LED display of claim 4, further comprising:
a protecting layer covering the encapsulation layer, wherein the protecting layer has a refractive index $n_{prot}$, and $n_{device} \geq n_1 \geq n_2 \geq n_{encap} \geq n_{prot}$.

6. The LED display of claim 4, wherein the second isolation layer at least partially covers the first isolation layer and the side surface of the micro light emitting device.

7. The LED display of claim 1, wherein the encapsulation layer comprises light diffusion particles distributed therein.

8. The LED display of claim 1, wherein the substrate comprises at least one pixel unit, the pixel unit comprises a plurality of sub-pixels, and the micro light emitting device is disposed inside one of the sub-pixels, and the encapsulation layer covers at least said one of the sub-pixels.

9. The LED display of claim 1, wherein the substrate comprises at least one pixel unit, the pixel unit comprises a plurality of sub-pixels, the micro light emitting device is disposed inside one of the sub-pixels, and the encapsulation layer covers the plurality of the sub-pixels.

10. The LED display of claim 1, wherein the micro light emitting device further comprises:
a first type semiconductor layer electrically connected with the first bottom electrode;
a second type semiconductor layer electrically connected with the opposite electrode; and
an active layer disposed between the first type semiconductor layer and the second type semiconductor layer, wherein the first isolation layer covers a side surface of the active layer.

11. The LED display of claim 10, wherein the micro light emitting device further comprises a current controlling layer having at least one opening therein, and the current controlling layer is joined with one of the first type semiconductor layer and the second type semiconductor layer.

12. The LED display of claim 10, further comprising:
a conductive layer disposed between the micro light emitting device and the first bottom electrode and electrically coupled with the first type semiconductor layer and the first bottom electrode.

13. The LED display of claim 12, wherein the conductive layer is a metal layer or a conductive adhesive layer.

14. The LED display of claim 1, wherein the first bottom electrode is a data electrode, the second bottom electrode is a common electrode, and the first and the second bottom electrodes are electrically connected with a pixel control circuit.

15. The LED display of claim 1, wherein the first bottom electrode is a common electrode and the second bottom electrode is a data electrode, and the first and the second bottom electrodes are electrically connected with a pixel control circuit.

16. The LED display of claim 1, wherein the substrate is an active matrix display substrate.

17. The LED display of claim 1, wherein the substrate is a passive matrix display substrate.

18. A manufacturing method of an LED display, comprising:
providing a substrate;
forming a first bottom electrode and a second bottom electrodes on the substrate;
disposing a micro light emitting device on the first bottom electrode, wherein the micro light emitting device is electrically connected to the first bottom electrode;
forming a first isolation layer, wherein the first isolation layer covers at least a side surface of the micro light emitting device, the first isolation layer has a refractive index $n_1$, the micro light emitting device has a refractive index $n_{device}$, and $n_{device} \geq n_1$;
forming an opposite electrode on the micro light emitting device, wherein the opposite electrode is electrically connected to the micro light emitting device and the second bottom electrode; and
forming an encapsulation layer, wherein the encapsulation layer covers at least the micro light emitting device and the first isolation layer.

19. The manufacturing method of claim 18, wherein the first isolation layer is formed before the opposite electrode.

20. The manufacturing method of claim 18, further comprising:
before forming the encapsulation layer, forming a second isolation layer, wherein the second isolation layer at least partially covers the first isolation layer and the side surface of the micro light emitting device.

* * * * *